(12) United States Patent
Basker et al.

(10) Patent No.: US 9,196,613 B2
(45) Date of Patent: Nov. 24, 2015

(54) STRESS INDUCING CONTACT METAL IN FINFET CMOS

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Mountain View, CA (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/083,544

(22) Filed: Nov. 19, 2013

(65) Prior Publication Data

US 2015/0137181 A1    May 21, 2015

(51) Int. Cl.
| | |
|---|---|
| H01L 29/66 | (2006.01) |
| H01L 27/092 | (2006.01) |
| H01L 21/8238 | (2006.01) |
| H01L 29/78 | (2006.01) |

(52) U.S. Cl.
CPC .... H01L 27/0924 (2013.01); H01L 21/823821 (2013.01); H01L 29/7845 (2013.01)

(58) Field of Classification Search
CPC ...................... H01L 29/2003; H01L 29/66462; H01L 29/7787; H01L 29/7783; H01L 29/802; H01L 21/8232; H01L 21/845; H01L 27/0086; H01L 27/0924; H01L 27/10826; H01L 27/1211
USPC ......... 257/192, 134, 205, 206, 262, 288, 390, 257/E21.632, E29.314, E29.265, E29.264, 257/E51.005, E51.006; 438/438, 197, 438/FOR. 163, FOR. 190, FOR. 174, 438/FOR. 175, FOR. 424

See application file for complete search history.

(56) References Cited

U.S. PATENT DOCUMENTS

| | | | |
|---|---|---|---|
| 7,875,543 | B1 | 1/2011 | Luo et al. |
| 7,888,214 | B2 | 2/2011 | Teo et al. |
| 8,105,887 | B2 | 1/2012 | Luo et al. |
| 8,124,473 | B2 | 2/2012 | Pan et al. |
| 8,159,009 | B2 | 4/2012 | Yang |
| 8,361,851 | B2 | 1/2013 | Zhu et al. |
| 8,362,574 | B2 | 1/2013 | Kawasaki et al. |
| 8,440,516 | B2 | 5/2013 | Wei et al. |

(Continued)

FOREIGN PATENT DOCUMENTS

JP    2013511852 A    4/2013

Primary Examiner — Thao X Le
Assistant Examiner — Nduka Ojeh
(74) Attorney, Agent, or Firm — Michael A. Petrocelli; Howard M. Cohn

(57) ABSTRACT

A method of forming a semiconductor structure includes forming a first plurality of fins in a first region of a semiconductor substrate and a second plurality of fins in a second region of a semiconductor substrate. A gate structure is formed covering a first portion of the first and second plurality of fins. The gate structure does not cover a second portion of the first and second plurality of fins. A first epitaxial layer is grown surrounding the second portion of the first plurality of fins and a second epitaxial layer is grown surrounding the second portion of the second plurality of fins. An ILD layer is deposited and partially etched to expose the first epitaxial layer and a top portion of the second epitaxial layer. A metal layer is deposited around the first epitaxial layer and above the top portion of the second epitaxial layer.

6 Claims, 9 Drawing Sheets

(56) References Cited

U.S. PATENT DOCUMENTS

| | | |
|---|---|---|
| 2006/0189051 A1* | 8/2006 | Kim .................. 438/154 |
| 2006/0220113 A1 | 10/2006 | Tamura et al. |
| 2008/0157224 A1* | 7/2008 | Fischer et al. ........... 257/401 |
| 2011/0079855 A1 | 4/2011 | Chan et al. |
| 2011/0115000 A1* | 5/2011 | Yang .................. 257/288 |
| 2011/0298058 A1* | 12/2011 | Kawasaki et al. ........ 257/401 |
| 2012/0276695 A1* | 11/2012 | Cheng et al. ............ 438/154 |
| 2013/0168771 A1* | 7/2013 | Wu et al. ............... 257/351 |
| 2014/0001520 A1* | 1/2014 | Glass et al. ............. 257/288 |

* cited by examiner

STRESS INDUCING CONTACT METAL IN FINFET CMOS

BACKGROUND

The present invention generally relates to semiconductor structures, and more particularly to field effect transistor (FET) devices including FinFET devices having strained channel regions, and methods for making the same.

Complementary metal-oxide-semiconductor (CMOS) technology is commonly used for fabricating FETs as part of advanced integrated circuits (IC), such as CPUs, memory, storage devices, and the like. As integrated circuits continue to scale downward in size, there is a growing need in CMOS technology to achieve higher device density without affecting performance and/or reliability while keeping production costs down.

With the aim of increasing device density, fin field effect transistors (FinFETs), or tri-gate structures, are becoming more widely used, primarily because FinFETs may offer better performance than planar FETs at the same power budget. FinFETs are three dimensional (3-D), fully depleted metal-oxide semiconductor field effect transistor (MOSFET) devices representing an important part of CMOS fabrication technology to create microelectronic devices with ever-decreasing dimensions.

FinFETs may have a fin structure formed from a semiconductor substrate material. The fin may form a channel region located between a source region and a drain region. A gate structure may be located over the fin enfolding the channel region. Such architecture allows for a more precise control of the conducting channel by the gate, significantly reducing the amount of current leakage when the device is in off state.

Channel straining techniques are commonly used in CMOS manufacturing to enhanced carrier mobility in the channel region. Based on the type of carrier and the direction of the stress applied, the carrier mobility within the channel region may be enhanced or reduced. For example, in a p-type FET (p-FET), applying a compressive stress to the channel region may increase hole mobility while reducing electron mobility, this in turn may improve the performance of p-FET devices. Similarly, in an n-type FET (n-FET), applying a tensile stress to the channel region may increase electron mobility while reducing hole mobility, this in turn may improve the performance of n-FET devices.

SUMMARY

The ability to manufacture FinFET devices including a strained channel region may facilitate advancing the capabilities of current bulk FinFET technology.

According to an embodiment of the present disclosure, a method of forming a semiconductor structure includes: forming a first plurality of fins in a first region of a semiconductor substrate and a second plurality of fins in a second region of a semiconductor substrate. A gate structure is formed covering a first portion of the first plurality of fins and a first portion of the second plurality of fins; the gate structure does not cover a second portion of the first plurality of fins and a second portion of the second plurality of fins. A first epitaxial layer is grown surrounding the second portion of the first plurality of fins and a second epitaxial layer is grown surrounding the second portion of the second plurality of fins. An interlayer dielectric (ILD) layer is deposited above the semiconductor substrate and partially etched to substantially expose the first epitaxial layer and to expose a top portion of the second epitaxial layer. A metal layer is deposited around the first epitaxial layer and above the top portion of the second epitaxial layer.

According to another embodiment of the present disclosure, a semiconductor structure includes: a first plurality of fins in a first region of a semiconductor substrate and a second plurality of fins in a second region of a semiconductor substrate. A gate structure above a first portion of the first plurality of fins and a first portion of the second plurality of fins. The gate structure does not cover a second portion of the first plurality of fins and a second portion of the second plurality of fins. A first epitaxial layer surrounding the second portion of the first plurality of fins and a second epitaxial layer surrounding the second portion of the second plurality of fins. An ILD layer above the semiconductor substrate, the ILD layer covers the gate structure and separating the first region of the semiconductor substrate from the second region of the semiconductor substrate and a metal layer around the first epitaxial layer and above the top portion of the second epitaxial layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. This invention may, however, be modified in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessary obscuring of the presented embodiments.

A method of forming a semiconductor structure, namely a FinFET device, including an improved strained channel region is described in detail below by referring to the accompanying drawings in FIGS. 1-9, in accordance with an illustrative embodiment of the present disclosure. Conventional channel straining techniques, including recessing the fins and epitaxially growing a stressor material, may be difficult to apply in FinFET manufacturing mostly due to the small dimensions of FinFET elements. Additionally, factors such as scaling of FinFET devices, FinFETs manufacturing materials, and 3-D topography may also impact effective channel straining if conducted using traditional strain engineering techniques. The ability to improve channel straining within FinFET devices may enhance device performance and reduce overall FinFET manufacturing costs.

In describing the method of forming a FinFET device having a strained channel region, one possible embodiment will be discussed in detail below by referring to the accompanying drawings in FIGS. 1-9. For illustration purposes only, without intent of limitation, in the figures and in the discussion one of the possible embodiments will be presented using an n-type FinFET device (n-FET) as example. However, each of the embodiments may equally apply to a p-type FinFET device (p-FET).

One possible embodiment to fabricate a strained channel region may include forming an unmerged source-drain region in a first device located in a first region of a semiconductor substrate and a merged source-drain region in a second device located in a second region of the semiconductor substrate. A metal layer may be formed surrounding the unmerged source-drain region to apply a stress to the channel region of the first device. The metal layer may lie on top of the merged source-drain region without affecting the channel region of the second device. One embodiment by which to fabricate the strained channel region is described in detail below by referring to the accompanying drawings in FIGS. 1-5.

Figure 1:
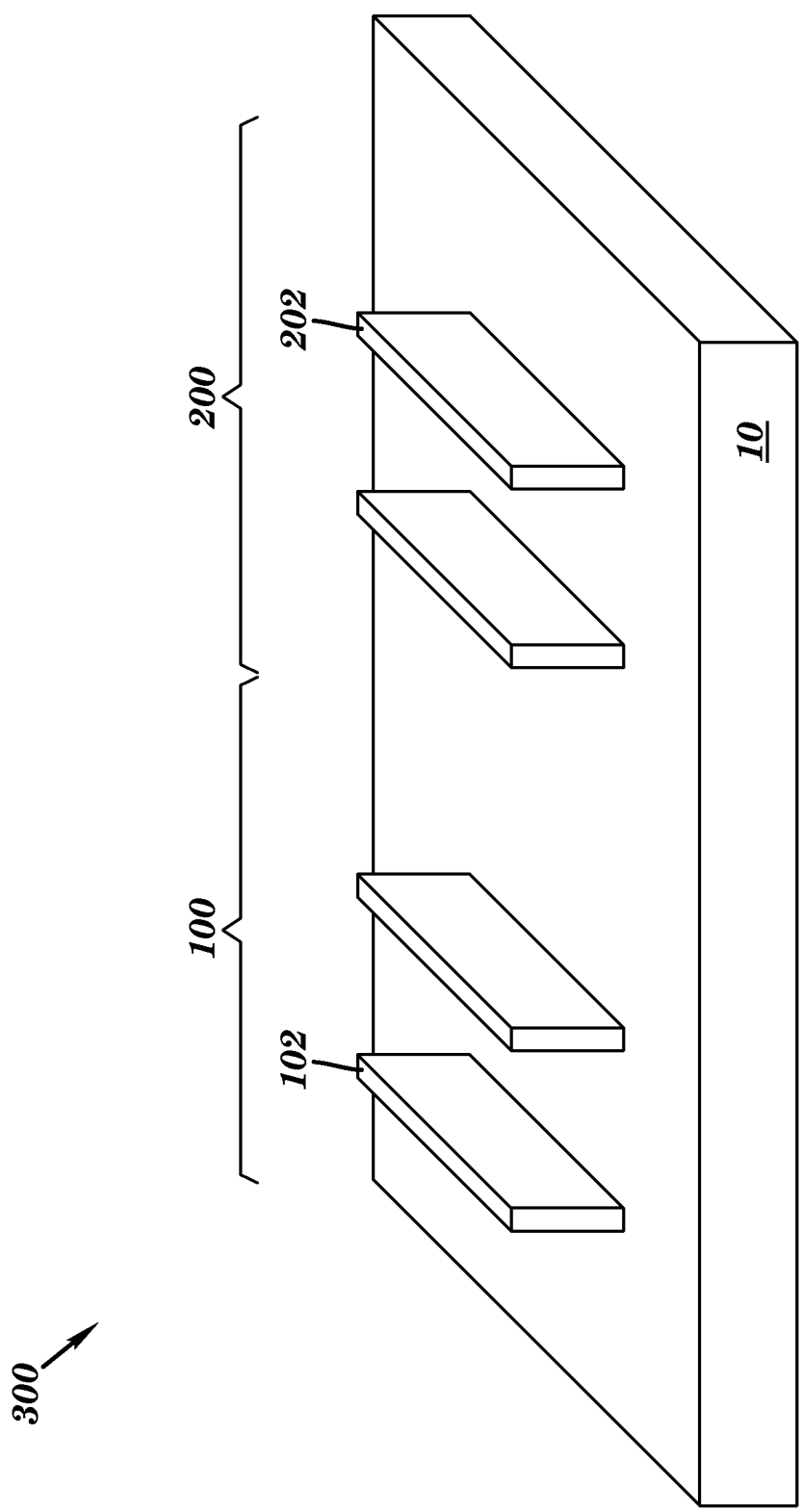
FIG. 1 is an isometric view of a semiconductor structure depicting a plurality of fins formed from a semiconductor substrate, according to an embodiment of the present disclosure.

Referring now to FIG. 1, a 3-dimensional (3D) view of a semiconductor structure 300 is shown. At this point of the manufacturing process, the semiconductor structure 300 may include a first plurality of fins 102 (hereinafter "first fins") and a second plurality of fins 202 (hereinafter "second fins") formed from a semiconductor substrate 10. It should be noted that the first fins 102 and the second fins 202 may be formed in any semiconductor substrate known to a person having ordinary skill in the art, including but not limited to SOI substrates and bulk silicon substrates. The first and second fins 102, 202 may be etched from the semiconductor substrate 10 using typical photolithography techniques, such as for example, sidewall image transfer (SIT).

The first fins 102 may be formed in a first region 100 of the semiconductor substrate 10, and the second fins 202 may be formed in a second region 200 of the semiconductor substrate 10. According to an embodiment of the present disclosure, the first region 100 of the semiconductor substrate 10 may include an n-FET region (hereinafter "n-FET region"), and the second region 200 of the semiconductor substrate 10 may include a p-FET region (hereinafter "p-FET region").

Figure 2:
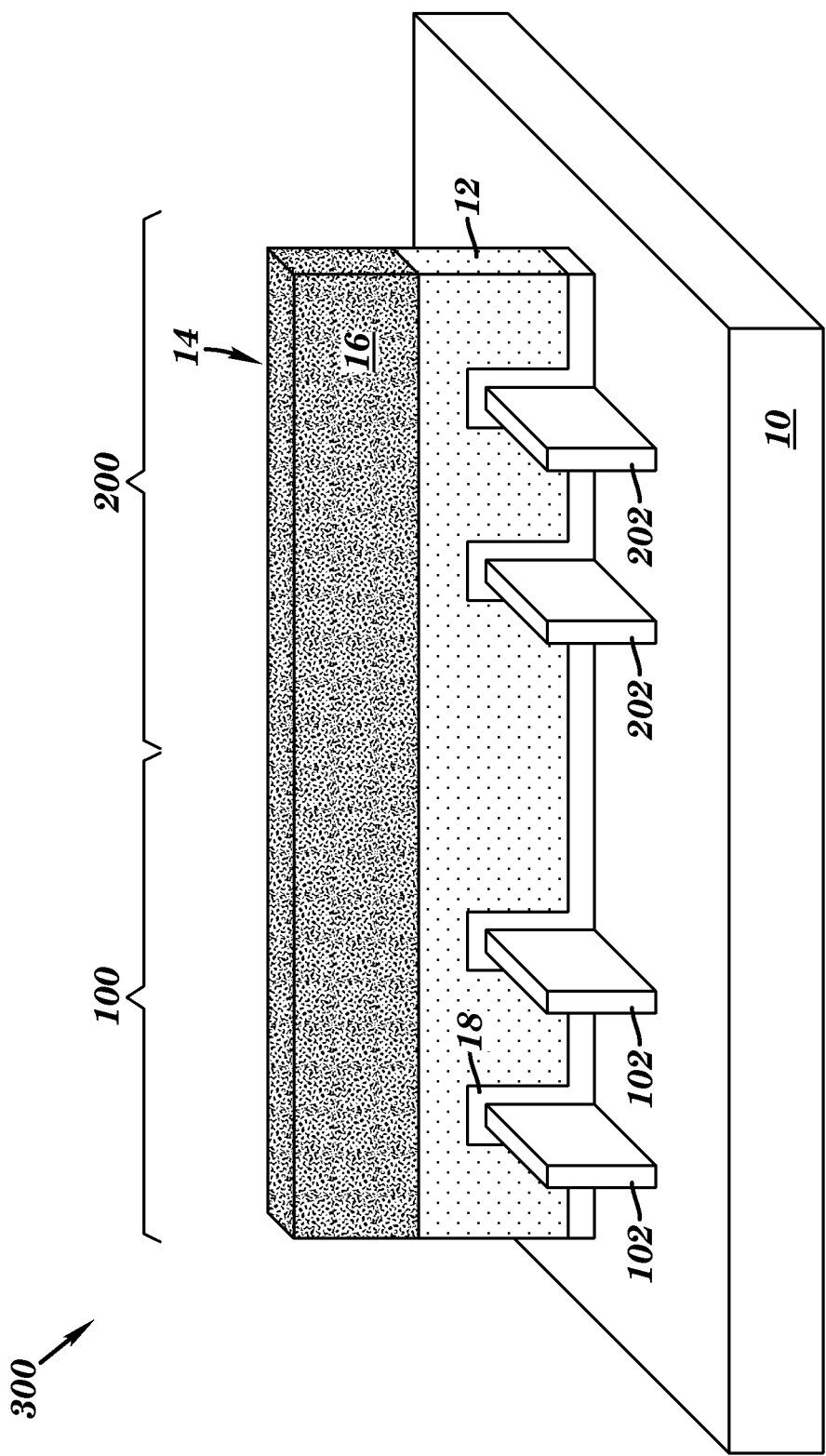
FIG. 2 is an isometric view of a semiconductor structure depicting the formation of a gate structure over the plurality of fins, according to an embodiment of the present disclosure.

Referring now to FIG. 2, a gate structure 14 may be formed over a portion of the first and second fins 102, 202. It should be noted that the FinFET device may be fabricated using either a replacement metal gate (RMG) or gate last process flow, or a gate first process flow. The embodiment described below uses a gate first process flow.

At this point of the manufacturing process, the gate structure 14 may include a gate dielectric 18, a metal gate 12 and a gate cap 16. The gate dielectric 18, the metal gate 12 and the gate cap 16 may also be referred to as a gate stack. The gate dielectric 18 may be formed by any suitable deposition technique known in the art, such as, for example, chemical vapor deposition (CVD), plasma-assisted CVD, atomic layer deposition (ALD), evaporation, reactive sputtering, chemical solution deposition or other like deposition processes. The gate dielectric 18 may include an insulating material including, but not limited to: oxide, nitride, oxynitride or silicate including metal silicates and nitrided metal silicates. In one embodiment, the gate dielectric 18 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric 18 may vary, but typically may have a thickness ranging from about 0.5 nm to about 10 nm. More preferably the gate dielectric 18 may have a thickness ranging from about 0.5 nm to about 3 nm.

The metal gate 12 may be formed on top of the gate dielectric 18. The metal gate 12 may be deposited by any suitable technique known in the art, for example by atomic layer deposition (ALD), chemical vapor deposition (CVD), physical vapor deposition (PVD), molecular beam deposition (MBD), pulsed laser deposition (PLD), or liquid source misted chemical deposition (LSMCD). The metal gate 12 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC), and any combination of those materials. In one embodiment, the metal gate 12 may include tungsten (W). Furthermore, the gate cap 16 may be formed on top of the metal gate 12 using any suitable deposition technique known in the art. The gate cap 16 may include but is not limited to, for example, silicon oxide, silicon nitride, silicon oxynitride, boron nitride, or any suitable combination of those materials.

Figure 3:
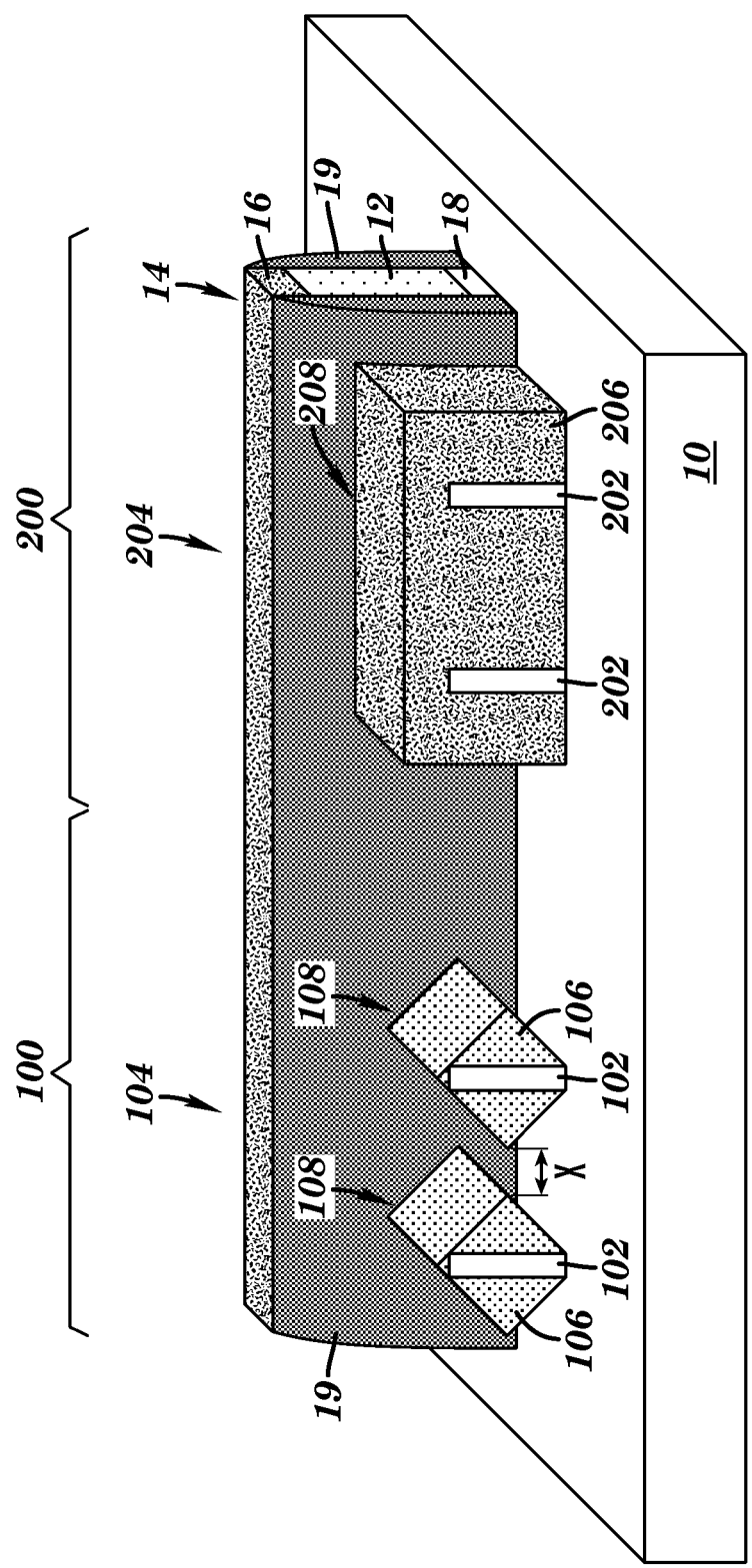
FIG. 3 is an isometric view of a semiconductor structure depicting the formation of an unmerged source-drain region and a merged source-drain region in the semiconductor substrate, according to an embodiment of the present disclosure.

Referring now to FIG. 3, a pair of gate spacers 19 may be formed on opposite sidewalls of the gate structure 14. The pair of gate spacers 19 may be made from an insulator material such as an oxide, nitride, oxynitride, silicon carbon oxynitride, silicon boron oxynitride, low-k dielectric, or any combination thereof. The pair of gate spacers 19 may be made from a similar or different material than the gate cap 16. In one embodiment, the pair of gate spacers 19 may be made from a nitride and may be formed by conventional deposition and etching techniques.

A first epitaxial layer 106 may be grown on an exposed surface of the first fins 102. Growth of the first epitaxial layer 106 in the exposed surfaces of the first fins 102 may form unmerged source-drain regions 108 for an n-FET device 104 located in the n-FET region 100 of the semiconductor substrate 10. Alternately, the first fins 102 may be recessed prior to the growth of the first epitaxial layer 106.

The first epitaxial layer 106 may include selective epitaxial growth of an in-situ n-type doped material on the exposed surfaces of the first fins 102. The first epitaxial layer 106 may have a smaller lattice constant relative to the lattice constant of silicon (Si). By having a smaller lattice constant, the first epitaxial layer 106 may induce a tensile stress on the channel region of the n-FET device 104. In one embodiment, the first epitaxial layer 106 forming the unmerged source-drain regions 108 in the n-FET device 104 may include a carbon-doped silicon (Si:C) material, where the atomic concentration of carbon (C) may range from about 0.2-3.0%. The n-type dopant may include any known dopant use in the fabrication of an n-FET device, such as, for example, phosphorus or arsenic. In one embodiment, the dopant concentration may range from about $1\times10^{19}$ cm$^{-3}$ to about $2\times10^{21}$ cm$^{-3}$, and more preferably from about $1\times10^{20}$ cm$^{-3}$ to about $1\times10^{21}$ cm$^{-3}$.

The first epitaxial layer 106 may surround each individual fin of the first fins 102 without merging them so that each unmerged source-drain region 108 may be separated from one another by a distance x. Stated differently, growth of the first epitaxial layer 106 may include forming the first epitaxial layer 106 around an exposed surface of the first fins 102 such that the first epitaxial layer 106 surrounding one fin does not contact the first epitaxial layer 106 surrounding an adjacent fin. Prior to forming the first epitaxial layer 106, the p-FET region 200 may be protected by a masking layer (not shown). In one embodiment of the present disclosure, the unmerged source-drain regions 108 may have a diamond shape; however unmerged source-drain regions of any other shape may also be envisioned. The first epitaxial layer 106 may be grown by any suitable technique known in the art. A suitable technique may include for example, molecular beam epitaxy (MBE), CVD, ultra high vacuum CVD (UHCVD), and rapid thermal CVD (RTCVD). The first fins 102 may have the proper crystalline characteristics for accepting the first epitaxial layer 106. The structural consequence of epitaxial growth may be that a grown material and a host material, at their common interface, may include the same symmetry and crystalline orientation. Selective epitaxial growth may include epitaxial growth only on the exposed surfaces that may have proper crystalline qualities for accepting the growth material. After forming the first epitaxial layer 106, the masking layer above the p-FET region 200 may be removed.

A second epitaxial layer 206 may be formed on an exposed surface of the second fins 202. Growth of the second epitaxial layer 206 in the exposed surface of the second fins 202 may form a merged source-drain region 208 for a p-FET device 204 located in the p-FET region 200 of the semiconductor substrate 10. Alternately, the second fins 202 may be recessed prior to the growth of the second epitaxial layer 206.

The second epitaxial layer 206 may include selective epitaxial growth of an in-situ p-type doped material on the exposed surfaces of the second fins 202. The second epitaxial layer 206 may have a larger lattice constant relative to the lattice constant of silicon (Si). By having a larger lattice constant, the second epitaxial layer 206 may induce a compressive stress on the channel region of the p-FET device. In one embodiment, the second epitaxial layer 206 forming the merged source-drain region 208 in the p-FET device 204 may include a silicon-germanium (SiGe) material, where the atomic concentration of germanium (Ge) may range from about 10% to about 80%. In another embodiment, the concentration of germanium (Ge) may range from about 25 to about 50%. The p-type dopant may include any known dopant use in the fabrication of a p-FET device, such as, for example, boron. In one embodiment, the dopant concentration may range from about $1\times10^{19}$ cm$^{-3}$ to about $2\times10^{21}$ cm$^{-3}$, and more preferably from about $1\times10^{20}$ cm$^{-3}$ to about $1\times10^{21}$ cm$^{-3}$.

The second epitaxial layer 206 may be formed on sidewalls and on top of the second fins 202, substantially filling the space between each fin of the second fins 202 combining them and forming the merged source-drain region 208. Stated differently, growth of the second epitaxial layer 206 may include forming the second epitaxial layer 206 around an exposed surface of the second fins 202 such that the second epitaxial layer 206 surrounding one fin contacts the second epitaxial layer 206 surrounding an adjacent fin. Prior to forming the second epitaxial layer 206, the n-FET region 100 may be protected by a masking layer (not shown). The second epitaxial layer 206 may be grown by any suitable technique known in the art. A suitable technique may include for example, molecular beam epitaxy (MBE), CVD, ultra high vacuum CVD (UHCVD), and rapid thermal CVD (RTCVD). The second fins 202 may have the proper crystalline characteristics for accepting the second epitaxial layer 206. After forming the second epitaxial layer 206, the masking layer above the n-FET region 100 may be removed.

Figure 4:
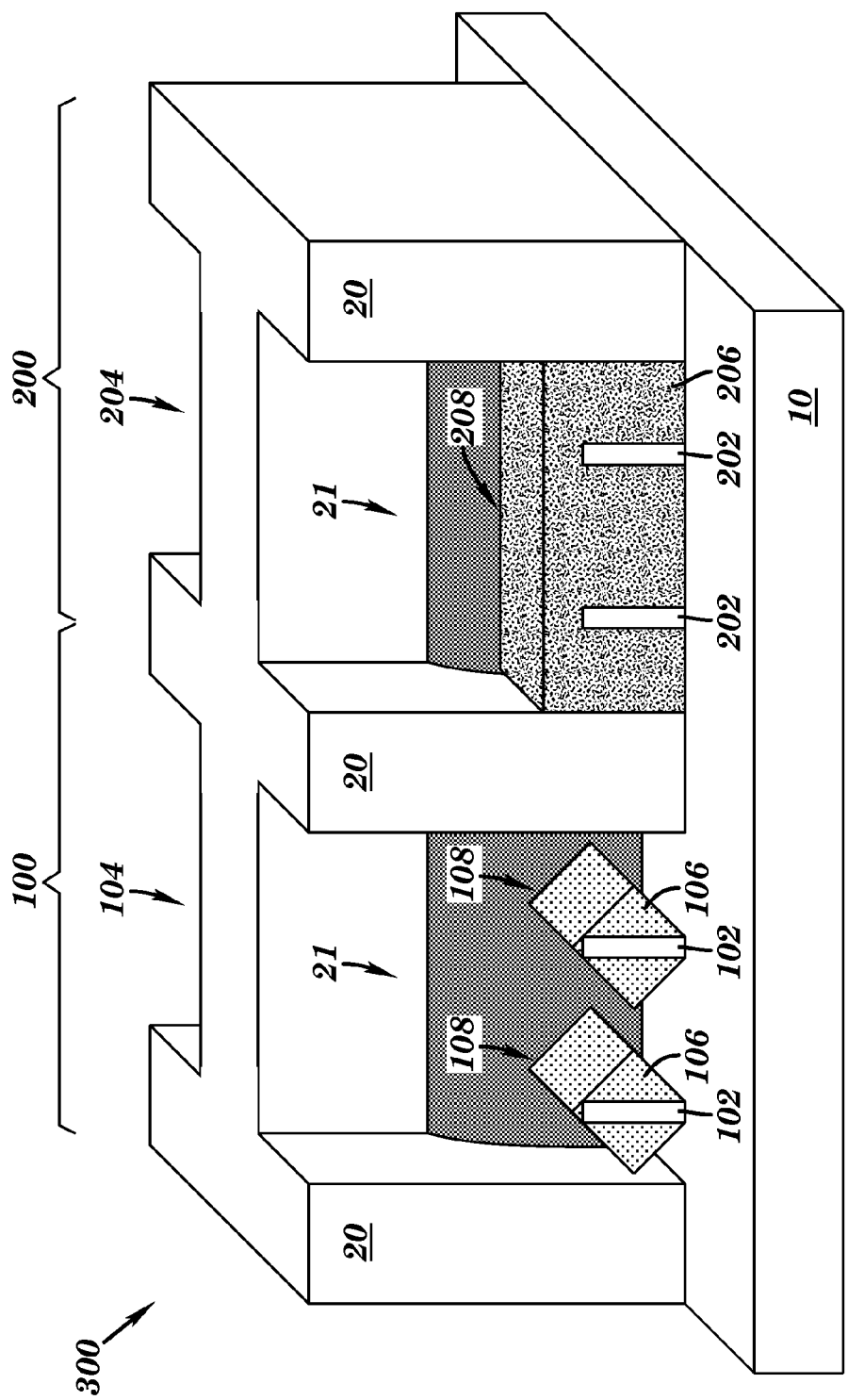
FIG. 4 is an isometric view of a semiconductor structure depicting the deposition and etching of an ILD layer formed on the semiconductor substrate, according to an embodiment of the present disclosure.

Referring now to FIG. 4, an interlayer dielectric (ILD) layer 20 may be formed above the semiconductor substrate 10. After forming the ILD layer 20, contact holes 21 may be formed in the ILD layer 20 to expose the unmerged and merged source-drain regions 108, 208. The contact holes 21 may be formed in such a way that the first epitaxial layer 106 of the unmerged source-drain regions 108 may be substantially exposed and only a top surface of the second epitaxial layer 206 of the merged source-drain region 208 may be exposed.

The ILD layer 20 may be formed by any suitable deposition method known in the art, for example, by chemical vapor deposition (CVD) of a dielectric material. The ILD layer 20 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics The ILD layer 20 may cover the gate structure 14 (shown in FIG. 3) and the unmerged and merged source-drain regions 108, 208. The ILD layer 20 may fill the gaps between gate structures and other existing devices within the semiconductor structure 300.

The contact holes 21 may be formed by any photolithographic patterning process including, for example an anisotropic etching process such as reactive ion etching (RIE) or plasma etching. Formation of the contact holes 21 may substantially exposed the unmerged source-drain regions 108 in the n-FET device 104. The contact hole 21 may also expose a top surface of the merged source-drain region 208 in the p-FET device 204.

To ensure a flat top surface of the ILD layer 20 prior to forming the contact holes 21, a chemical mechanical polish (CMP) technique may be conducted to remove any excess of the ILD layer 20 from the semiconductor structure 300.

Figure 5:
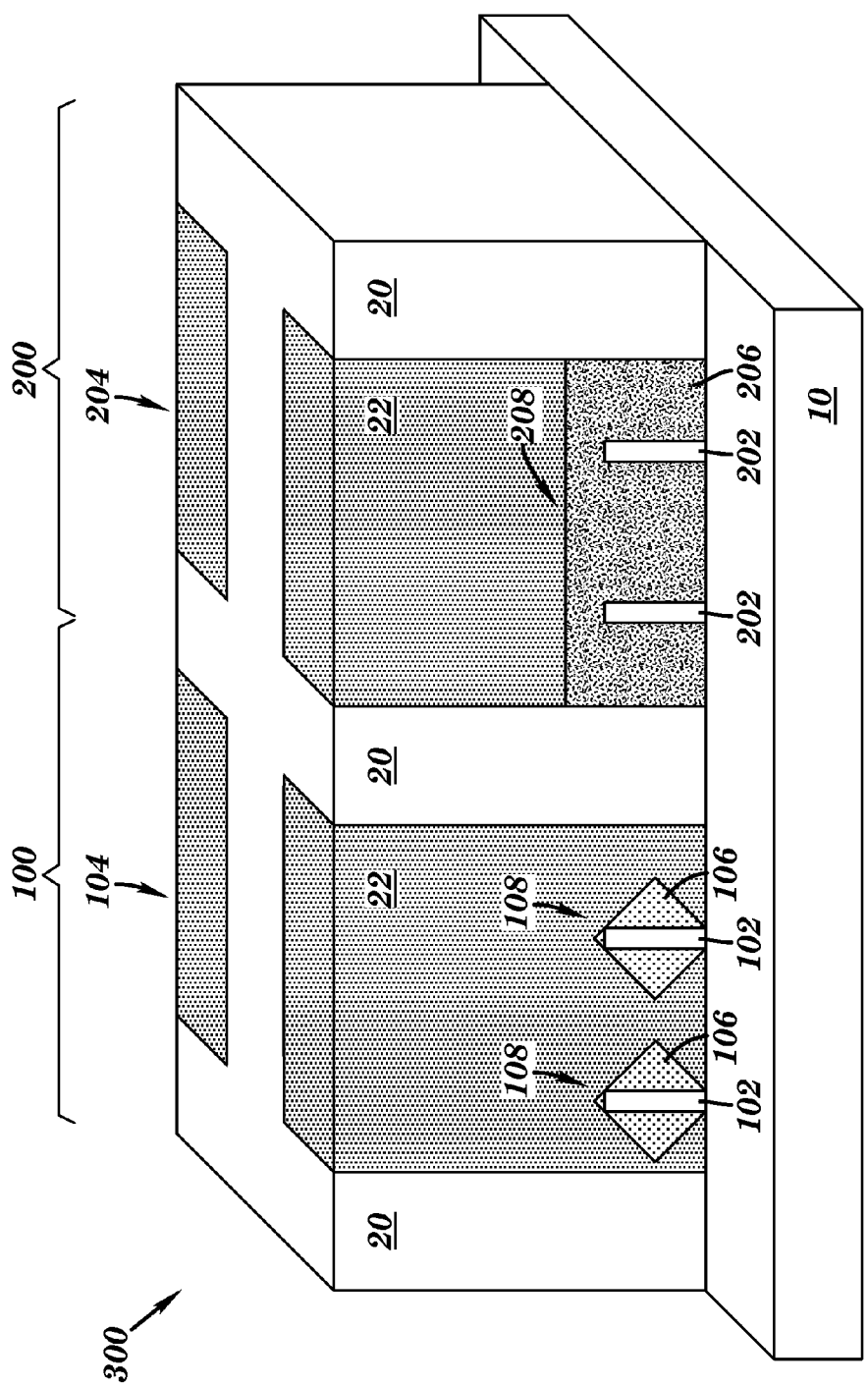
FIG. 5 is an isometric view of a semiconductor structure depicting the formation of a metal layer around the unmerged source-drain region and above the merged source-drain region, according to an embodiment of the present disclosure.

Referring now to FIG. 5, a contact metal layer 22 (hereinafter "metal layer") may be conformally deposited within the contact holes 21 (shown in FIG. 4). The metal layer 22 may be formed by any deposition method, including but not limited to atomic layer deposition (ALD), chemical vapor deposition (CVD) and plating. The metal layer 22 may include any suitable metal or conductive metal compound. The metal layer 22 may be formed by several metal layers (not shown) of different materials. In one embodiment, for example, the metal layer 22 may include multiple layers including a titanium (Ti) liner, a titanium nitride (TiN) liner and a tungsten (W) layer. The materials selected to form the metal layer 22 may apply a tensile stress to the channel region of the n-FET device 204 which may improve device performance.

The metal layer 22 may surround the first epitaxial layer 106 of the unmerged source-drain regions 108. By substantially surrounding a perimeter of the first epitaxial layer 106, the metal layer 22 may effectively exert a tensile stress on the channel region of the n-FET device 104 thus improving electron mobility in the channel region and further enhancing n-FET device performance. Furthermore, by having the metal layer 22 surrounding the first epitaxial layer 106, the contact area between the metal layer 22 and the first epitaxial layer 106 may be maximized and thus the contact resistance may be minimized.

In the p-FET device 204, the metal layer 22 may be positioned above a top surface of the second epitaxial layer 206 of the merged source-drain region 208 hence remaining above the channel region of the p-FET device 204. This in turn may prevent the tensile characteristics of the metal layer 22 affecting the performance of the p-FET device 204. Stated differently, the compressive nature of the p-FET channel region may not be affected by the deposition of the metal layer 22 since it may remain separated from the p-FET channel region by the second epitaxial layer 206.

Therefore, formation of unmerged source-drain regions in an n-FET device and a merged source-drain region in a p-FET device before depositing a stress inducing metal layer of tensile characteristic may have advantages over known techniques of fabricating a strained n-type channel region. First, the metal layer wraps around the unmerged source-drain regions in the n-FET device so that the metal layer is closer to the channel region, effectively applying a tensile stress to the channel region enhancing electron mobility. Second, the metal layer in the p-FET device remains away from the channel region; this allows the benefit of minimizing impact on p-FET device performance. Third, since the stress inducing metal layer of tensile characteristics remains separated from the p-FET channel region, the same metal may be used during the fabrication of n-FET and p-FET devices, possibly reducing FinFET manufacturing costs.

In one embodiment, after the metal layer 22 is formed, the semiconductor structure 300 may be subjected to a thermal annealing process, using conventional processes such as, but not limited to, rapid thermal annealing (RTA). During the thermal annealing process, the metal layer 22 reacts with the silicon present in the unmerged and merged source-drain regions 108, 208 to form a metal silicide (not shown). In another embodiment, a silicide may be formed by using a conventional self-aligned silicide (salicide) process. In the self-aligned silicide process, a metal may be deposited on a surface of the epitaxial layer followed by a thermal annealing process, such as RTA, the metal may react with the epitaxial layer to form a metal silicide. After the annealing process, an etching process may be carried out to remove substantially all un-reacted. The etching process may include a wet etching method.

Next, gate contacts (not shown) may be patterned and formed. The process of patterning and formation of gate contacts may include a succession of techniques that may include photolithography and photomasking, wet or dry etching and metal deposition.

An alternate embodiment by which to fabricate a strained channel may include forming first unmerged source-drain regions in a first device located in a first region of a semiconductor substrate and second unmerged source-drain regions in a second device located in a second region of the semiconductor substrate. Then, a metal layer may be formed surrounding the first unmerged source-drain regions to apply a stress to the channel region of the first device. The metal layer may lie on top of a remaining portion of an ILD layer located between the second unmerged source-drain regions without affecting the channel region of the second device. The alternate embodiment is described in detail below by referring to the accompanying drawings in FIGS. 6-9.

Figure 6:
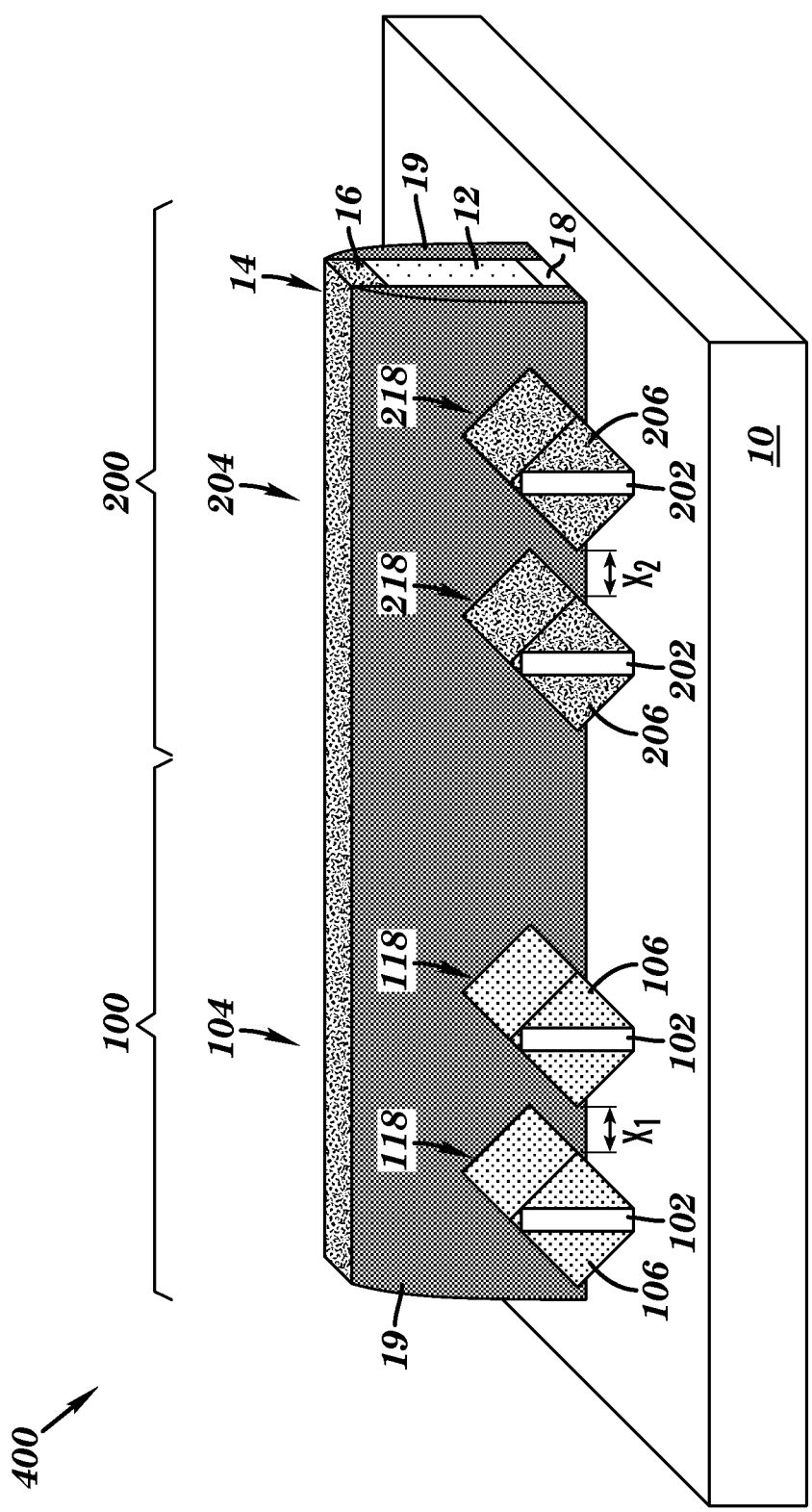
FIG. 6 is an isometric view of a semiconductor structure depicting the formation of a first unmerged source-drain region and a second unmerged source-drain region in a semiconductor substrate, according to an alternate embodiment of the present disclosure.

Referring now to FIG. 6, a semiconductor structure 400 is shown, according to an alternate embodiment of the present disclosure. At this point of the manufacturing process, the semiconductor structure 400 may include a gate structure 14, a pair of gate spacers 19, first fins 102 and second fins 202. The first fins 102 may be formed in an n-FET region 100 of the semiconductor substrate 10 and the second fins 202 may be formed in a p-FET region 200 of the semiconductor substrate 10.

In this alternate embodiment, materials and techniques used in the fabrication of the gate structure 14, the gate spacers 19 and the first and second fins 102, 202 may be similar to the ones described above in FIGS. 1-5.

With continued reference to FIG. 6, a first epitaxial layer 106 may be grown on an exposed surface of the first fins 102. Growth of the first epitaxial layer 106 in the exposed surfaces of the first fins 102 may form first unmerged source-drain regions 118 for an n-FET device 104 located in the n-FET region 100 of the semiconductor structure 400. Alternately, the first fins 102 may be recessed prior to the growth of the first epitaxial layer 106.

The first epitaxial layer 106 may include selective epitaxial growth of an in-situ n-type doped material on the exposed surfaces of the first fins 102. The first epitaxial layer 106 may have a smaller lattice constant relative to the lattice constant of silicon (Si). By having a smaller lattice constant, the first epitaxial layer 106 may induce a tensile stress on the channel region of the n-FET device 104. In one embodiment, the first epitaxial layer 106 forming the first unmerged source-drain regions 118 in the n-FET device 104 may include a carbon-doped silicon (Si:C) material, where the atomic concentration of carbon (C) may range from about 0.2-3.0%. The n-type dopant may include any known dopant use in the fabrication of an n-FET device, such as, for example, phosphorus or arsenic. In one embodiment, the dopant concentration may range from about $1\times10^{19}$ $cm^{-3}$ to about $2\times10^{21}$ $cm^{-3}$, and more preferably from about $1\times10^{20}$ $cm^{-3}$ to about $1\times10^{21}$ $cm^{-3}$.

The first epitaxial layer 106 may surround each individual fin of the first fins 102 without merging them so that each first unmerged source-drain region 118 may be separated from one another by a distance $x_1$. Stated differently, growth of the first epitaxial layer 106 may include forming the first epitaxial layer 106 around an exposed surface of the first fins 102 such that the first epitaxial layer 106 surrounding one fin does not contact the first epitaxial layer 106 surrounding an adjacent fin. Prior to forming the first epitaxial layer 106, the p-FET region 200 may be protected by a masking layer (not shown). In one embodiment of the present disclosure, the first unmerged source-drain regions 118 may have a diamond shape; however unmerged source-drain regions of any other shape may also be envisioned. The first epitaxial layer 106 may be grown by any suitable technique known in the art. A suitable technique may include for example, molecular beam epitaxy (MBE), CVD, ultra high vacuum CVD (UHCVD), and rapid thermal CVD (RTCVD). The first fins 102 may have the proper crystalline characteristics for accepting the first epitaxial layer 106. The structural consequence of epitaxial growth may be that a grown material and a host material, at their common interface, may include the same symmetry and crystalline orientation. Selective epitaxial growth may include epitaxial growth only on the exposed surfaces that may have proper crystalline qualities for accepting the growth material. After forming the first epitaxial layer 106, the masking layer above the p-FET region 200 may be removed.

A second epitaxial layer 206 may be formed on an exposed surface of the second fins 202. Growth of the second epitaxial layer 206 in the exposed surface of the second fins 202 may form second unmerged source-drain regions 218 for a p-FET device 204 located in the p-FET region 200 of the semiconductor substrate 10. Alternately, the second fins 202 may be recessed prior to the growth of the second epitaxial layer 206.

The second epitaxial layer 206 may include selective epitaxial growth of an in-situ p-type doped material on the exposed surfaces of the second fins 202. The second epitaxial layer 206 may have a larger lattice constant relative to the lattice constant of silicon (Si). By having a larger lattice constant, the second epitaxial layer 206 may induce a compressive stress on the channel region of the p-FET device. In one embodiment, the second epitaxial layer 206 forming the first unmerged source-drain regions 208 in the p-FET device 204 may include a silicon-germanium (SiGe) material, where the atomic concentration of germanium (Ge) may range from about 10% to about 80% In another embodiment, the concentration of germanium (Ge) may range from about 25 to about 50%. The p-type dopant may include any known dopant use in the fabrication of a p-FET device, such as, for example, boron. In one embodiment, the dopant concentration may range from about $1\times10^{19}$ cm$^{-3}$ to about $2\times10^{21}$ cm$^{-3}$, and more preferably from about $1\times10^{20}$ cm$^{-3}$ to about $1\times10^{21}$ cm$^{-3}$.

The second epitaxial layer 206 may surround each individual fin of the second fins 202 without merging them so that each second unmerged source-drain region 218 may be separated from one another by a distance $x_2$. Stated differently, growth of the second epitaxial layer 206 may include forming the second epitaxial layer 206 around an exposed surface of the second fins 202 such that the second epitaxial layer 206 surrounding one fin does not contact the second epitaxial layer 206 surrounding an adjacent fin. Prior to forming the second epitaxial layer 206, the n-FET region 100 may be protected by a masking layer (not shown). In one embodiment of the present disclosure, the second unmerged source-drain regions 218 may have a diamond shape; however unmerged source-drain regions of any other shape may also be envisioned. The second epitaxial layer 206 may be grown by any suitable technique known in the art. A suitable technique may include for example, molecular beam epitaxy (MBE), CVD, ultra high vacuum CVD (UHCVD), and rapid thermal CVD (RTCVD). The second fins 202 may have the proper crystalline characteristics for accepting the second epitaxial layer 206. After forming the second epitaxial layer 206, the masking layer above the n-FET region 100 may be removed.

Figure 7:
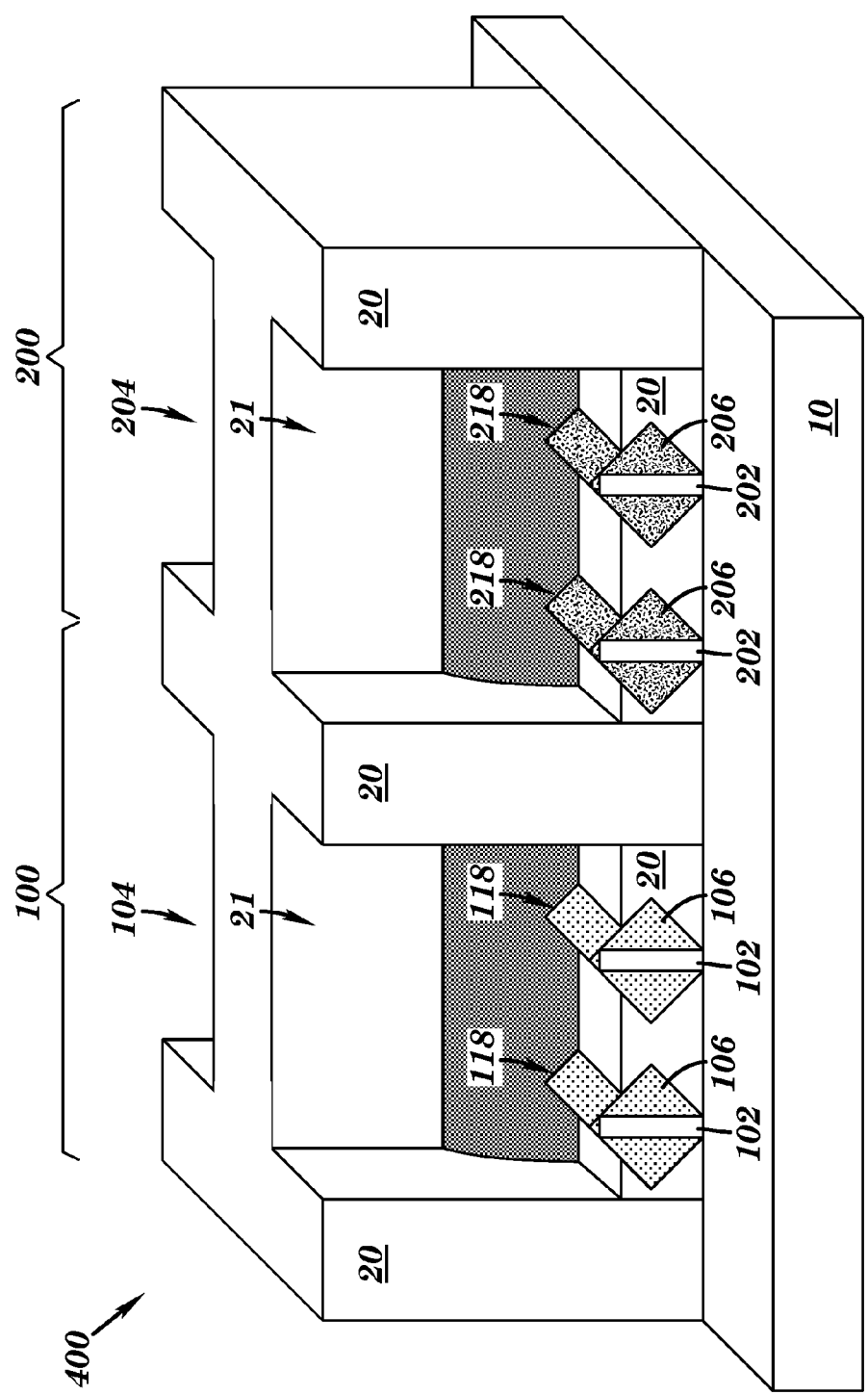
FIG. 7 is an isometric view of a semiconductor structure depicting the deposition and etching of an ILD layer formed on the semiconductor substrate, according to an alternate embodiment of the present disclosure.

Referring now to FIG. 7, an interlayer dielectric (ILD) layer 20 may be formed above the semiconductor substrate 10. After forming the ILD layer 20, contact holes 21 may be formed in the ILD layer 20 to expose a top portion of the first unmerged source-drain regions 118 and a top portion of the second unmerged source-drain regions 218.

The ILD layer 20 may be formed by any suitable deposition method known in the art, for example, by chemical vapor deposition (CVD) of a dielectric material. The ILD layer 20 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics. The ILD layer 20 may cover the gate structure 14 (shown in FIG. 6) and the first and second unmerged source-drain regions 118, 218. The ILD layer 20 may also fill the gaps between gate structures and other existing devices within the semiconductor substrate 10.

The contact holes 21 may be formed by any photolithographic patterning process including, for example an anisotropic etching process such as reactive ion etching (RIE) or plasma etching. Formation of the contact holes 21 may expose a top portion of the first and second unmerged source-drain regions 118, 218.

To ensure a flat top surface of the ILD layer 20 prior to forming the contact holes 21, a chemical mechanical polish (CMP) technique may be conducted to remove any excess of the ILD layer 20 from the semiconductor structure 400.

Figure 8:
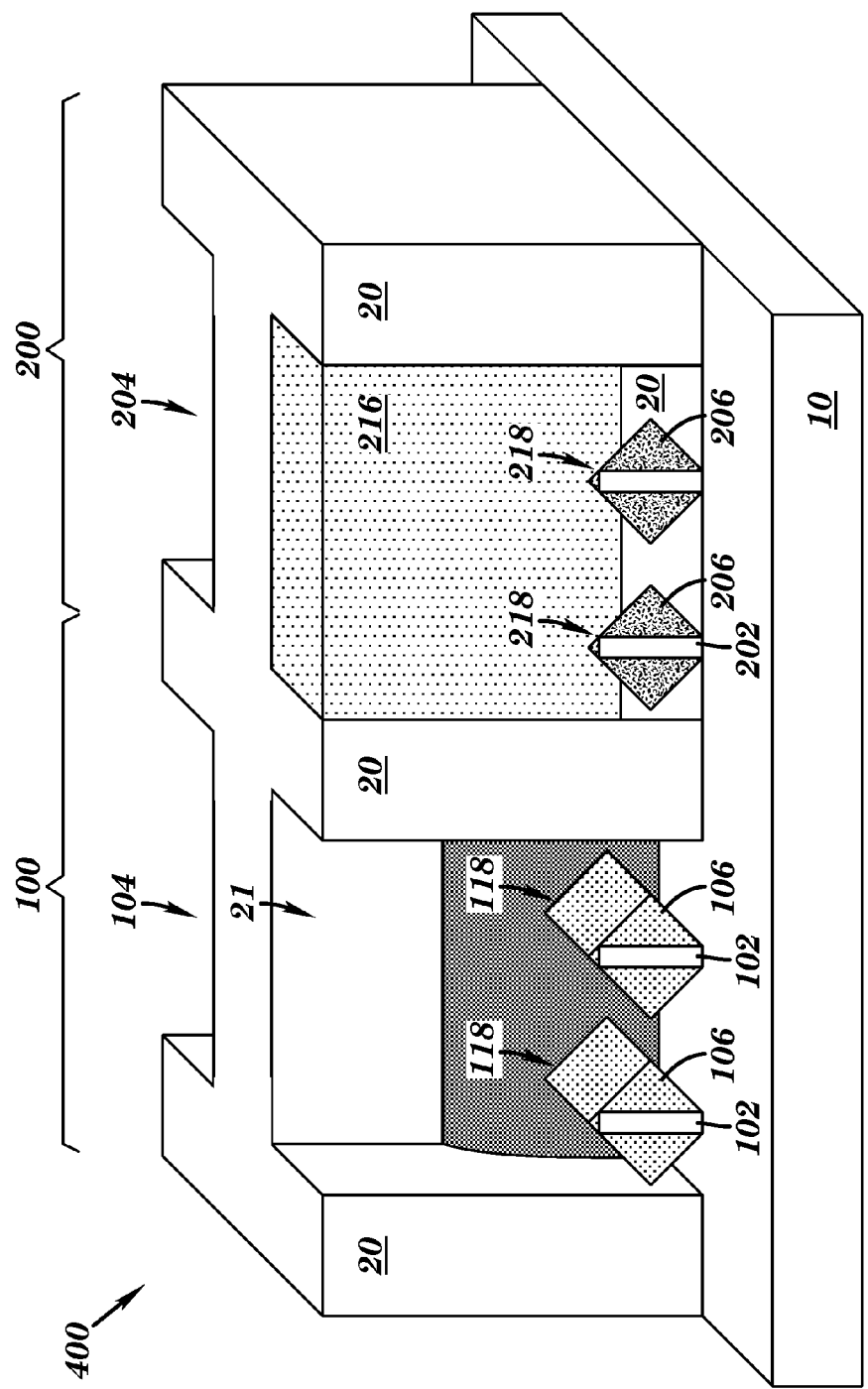
FIG. 8 is an isometric view of a semiconductor structure depicting the deposition of a masking layer above the second unmerged source-drain region, according to an alternate embodiment of the present disclosure.

Referring now to FIG. 8, a masking layer 216 may be formed in the contact hole 21 (FIG. 7) of the p-FET region 200. The masking layer 216 may protect the p-FET device 204 during etching of a remaining portion of the ILD layer 20 located between the first unmerged source-drain regions 118 of the n-FET device 104. The masking layer 216 may be a hardmask layer such as silicon nitride. The steps involved in masking the p-FET device 204 are conventional and well known to those skilled in the art.

The remaining portion of the ILD layer 20 in the n-FET device 104 may be removed, extending the contact hole 21 of the n-FET region 100, in such a way that the first epitaxial layer 106 of the first unmerged source-drain regions 118 may be substantially exposed. The remaining portion of the ILD layer 20 may be selectively removed by any suitable etching technique, for example, by an anisotropic etching process such as reactive ion etching (RIE) or plasma etching. After etching of the remaining portion of the ILD layer 20 from the n-FET device 104, the masking layer 216 may be removed. Removal of the masking layer 216 from the p-FET device 204 may create a space (not shown) above a remaining portion of the ILD layer 20 corresponding to the contact hole 21 shown in FIG. 7.

Figure 9:
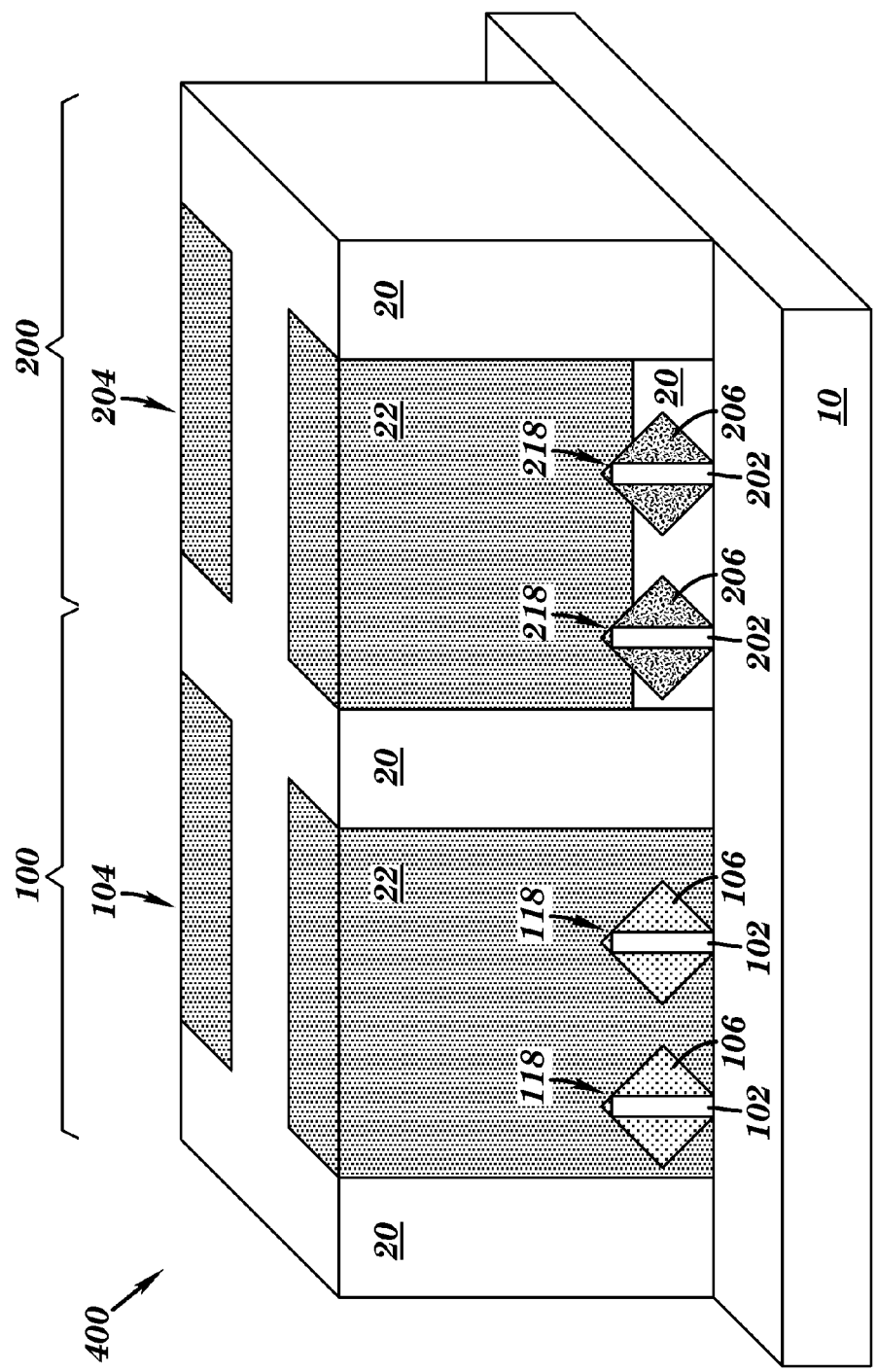
FIG. 9 is an isometric view of a semiconductor structure depicting the deposition of a metal layer around the first unmerged source-drain region and above the second unmerged source-drain region, according to an alternate embodiment of the present disclosure.

Referring now to FIG. 9, a contact metal layer 22 (hereinafter "metal layer") may be conformally deposited within the contact holes 21, above the first and second unmerged source-drain regions 118, 218. The metal layer 22 may be formed by any deposition method, including but not limited to atomic layer deposition (ALD), chemical vapor deposition (CVD) and plating. The metal layer 22 may include any suitable metal or conductive metal compound. The metal layer 22 may be formed by several metal layers (not shown) of different materials. In one embodiment, for example, the metal layer 22 may include multiple layers including a titanium (Ti) liner, a titanium nitride (TiN) liner and a tungsten (W) layer. The materials selected to form the metal layer 22 may apply a tensile stress to the channel region of the n-FET device 204 which may improve device performance.

The metal layer 22 may surround the first epitaxial layer 106 of the first unmerged source-drain regions 118. By substantially surrounding a perimeter of the first epitaxial layer 106 of the first unmerged source-drain regions 118, the metal layer 22 may effectively exert a tensile stress in the channel region of the n-FET device 104 thus improving electron mobility in the channel region and further enhancing n-FET device performance. Furthermore, by having the metal layer 22 surrounding the first epitaxial layer 106, the contact area between the metal layer 22 and the first epitaxial layer 106 may be maximized and thus the contact resistance may be minimized.

In the p-FET device 204, the metal layer 22 may be positioned above a top surface of the remaining portion of the ILD layer 20 located between the second unmerged source-drain regions 208. The contact metal layer 22 may remain above the channel region of the p-FET device 204 owing to the remaining portion of the ILD layer 20. This in turn may prevent the tensile characteristics of the metal layer 22 affecting the performance of the p-FET device 204. Stated differently, the compressive nature of the p-FET channel region may not be affected by the deposition of the metal layer 22 since it may remain separated from the p-FET channel region by the remaining portion of the ILD layer 20.

Therefore, formation of first unmerged source-drain regions in an n-FET device and second unmerged source-drain regions partially covered by an ILD layer in a p-FET device before depositing a stress inducing metal layer of tensile characteristic may have advantages over known techniques of fabricating a strained n-type channel region. First, the metal layer wraps around the first unmerged source-drain regions in the n-FET device so that the metal layer is closer to the channel region effectively applying a tensile stress that may enhance electron mobility. Second, the metal layer in the p-FET device remains away from the channel region; this allows the benefit of minimizing impact on p-FET device performance. Third, since the stress inducing metal layer of tensile characteristics remains separated from the p-FET channel region, the same metal may be used during the fabrication of n-FET and p-FET devices, possibly reducing Fin-FET manufacturing costs.

In one embodiment, after the metal layer 22 is formed, the semiconductor structure 400 may be subjected to a thermal annealing process, using conventional processes such as, but not limited to, rapid thermal annealing (RTA). During the thermal annealing process, the metal layer 22 reacts with the silicon present in the unmerged and merged source-drain regions 118, 218 to form a metal silicide (not shown). In another embodiment, a silicide may be formed by using a conventional self-aligned silicide (salicide) process. In the self-aligned silicide process, a metal may be deposited on a surface of the epitaxial layer followed by a thermal annealing process, such as RTA, the metal may react with the epitaxial layer to form a metal silicide. After the annealing process, an etching process may be carried out to remove substantially all un-reacted. The etching process may include a wet etching method.

Next, gate contacts (not shown) may be patterned and formed. The process of patterning and formation of gate contacts may include a succession of techniques that may include photolithography and photomasking, wet or dry etching and metal deposition.

The steps described above may provide a method for forming a semiconductor structure having a strained channel region. It should be understood that the semiconductor structures described above may include any two FET devices, in which a first FET device may include the metal contact layer applying a stress to the channel region of the first FET device and a second FET device may not include it. As illustrated above, the first FET device may include an n-FET device and the second FET device may include a p-FET device, although each of the embodiments may equally apply to the opposite case. Furthermore, the first FET device and the second FET device may both include a FET device of the same type, namely an n-FET device or a p-FET device. In such an instance, the first FET device may be a high performance (HP) FET and the second FET device may be a low power (LP) FET.

In another embodiment of the present disclosure, the method described above may be applicable to other semiconductor structures, such as nanowire FET devices. In this case, the gate structure 14 may enfold a nanowire channel located between a source-drain region. A stress may be applied to the nanowire channel by following the processing steps described above. It may be understood by a person having ordinary skills in the art that numerical values such as, for example, dopant concentration may be applied to this embodiment of the present disclosure. It may also be understood that some differences in the processing steps may vary according to nanowire FETs architecture.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, the method comprising:
    forming a first plurality of fins in a first region of a semiconductor substrate and a second plurality of fins in a second region of a semiconductor substrate;
    forming a gate structure covering a first portion of the first plurality of fins and a first portion of the second plurality of fins, the gate structure not covering a second portion of the first plurality of fins and a second portion of the second plurality of fins;
    growing a first epitaxial layer surrounding the second portion of the first plurality of fins after forming the gate structure, wherein the first epitaxial layer is unmerged;
    growing a second epitaxial layer surrounding the second portion of the second plurality of fins after forming the gate structure, wherein the second epitaxial layer is merged and completely fills a space between one fin in the second region and an adjacent fin in the second region;
    depositing an interlayer dielectric (ILD) layer above the semiconductor substrate;
    etching the ILD layer to remove the ILD layer in the second portion of the first region, thereby forming a first contact hole, and the ILD layer in the second portion of the second region, thereby forming a second contact hole, wherein the first contact hole is not in contact with the first epitaxial layer, and wherein the second contact hole is in direct physical contact with a top portion of the second epitaxial layer; and
    depositing a metal layer, wherein the metal layer is disposed around the first epitaxial layer and above the top portion of the second epitaxial layer.

2. The method of claim 1, wherein growing the first epitaxial layer comprises epitaxially growing in-situ phosphorous-doped carbon-doped silicon.

3. The method of claim 1, wherein growing the second epitaxial layer comprises epitaxially growing in-situ boron-doped silicon-germanium.

4. The method of claim 1, wherein depositing the metal layer comprises depositing an n-type metal to apply a tensile stress to the first portion of the first plurality of fins.

5. The method of claim 1, wherein the metal layer applies stress to the first portion of the first plurality of fins.

6. The method of claim 5, wherein the metal layer does not apply stress to the first portion of the second plurality of fins.

* * * * *